(12) United States Patent
Heikkinen et al.

(10) Patent No.: US 9,425,853 B2
(45) Date of Patent: Aug. 23, 2016

(54) AMPLIFIER UTILIZING A CONFIGURABLE INTERFACE TO A FRONT END MODULE

(71) Applicant: Broadcom Corporation, Irvine, CA (US)

(72) Inventors: Jari Jo Heikkinen, Espoo (FI); Jouni Kaukovuori, Vantaa (FI); Jonne Riekki, Espoo (FI)

(73) Assignee: BROADCOM CORPORATION, Irvine, CA (US)

( * ) Notice: Subject to any disclaimer, the term of this patent is extended or adjusted under 35 U.S.C. 154(b) by 105 days.

(21) Appl. No.: 14/340,308

(22) Filed: Jul. 24, 2014

(65) Prior Publication Data

US 2015/0341075 A1 Nov. 26, 2015

Related U.S. Application Data (60) Provisional application No. 62/000,935, filed on May 20, 2014.

(51) Int. Cl.

| | |
|---|---|
| H04B 1/48 | (2006.01) |
| H04B 1/12 | (2006.01) |
| H04B 15/00 | (2006.01) |
| H03F 1/02 | (2006.01) |
| H03F 1/22 | (2006.01) |
| H03F 3/195 | (2006.01) |
| H03F 3/45 | (2006.01) |
| H03F 3/68 | (2006.01) |
| H04B 1/00 | (2006.01) |
| H03F 3/72 | (2006.01) |
| H03F 1/56 | (2006.01) |

(52) U.S. Cl.
CPC ............... *H04B 1/48* (2013.01); *H03F 1/0272* (2013.01); *H03F 1/223* (2013.01); *H03F 1/565* (2013.01); *H03F 3/195* (2013.01); *H03F 3/45179* (2013.01); *H03F 3/45636* (2013.01); *H03F 3/68* (2013.01); *H03F 3/72* (2013.01); *H04B 1/005* (2013.01); *H04B 1/12* (2013.01); *H04B 15/00* (2013.01); *H03F 2200/111* (2013.01); *H03F 2200/27* (2013.01); *H03F 2200/294* (2013.01); *H03F 2203/45394* (2013.01); *H03F 2203/45544* (2013.01); *H03F 2203/45631* (2013.01)

(58) Field of Classification Search
CPC ....... H03F 1/02; H03F 1/0205; H03F 1/0283; H03F 1/08; H03F 1/083; H03F 1/22; H03F 1/56; H03F 1/32
See application file for complete search history.

(56) References Cited

U.S. PATENT DOCUMENTS

| | | | |
|---|---|---|---|
| 2010/0027568 A1* | 2/2010 | Rajendran ............ | H03K 17/693 370/532 |
| 2010/0194473 A1* | 8/2010 | Wright .................. | H03F 1/0227 330/124 R |
| 2012/0293259 A1* | 11/2012 | Riekki .................. | H03F 1/0277 330/253 |
| 2012/0293265 A1* | 11/2012 | Heikkinen .............. | H03F 1/565 330/291 |

OTHER PUBLICATIONS

Copyright 1999 by H. Paul Shuch, SETI League Technical Manual, Low Noise Amplifiers, http://www.setileague.org/hardware/blkIna.htm, p. 1-2.*

* cited by examiner

*Primary Examiner* — Bobbak Safaipour
*Assistant Examiner* — Devan Sandiford
(74) *Attorney, Agent, or Firm* — Foley & Lardner LLP (57) ABSTRACT

A system and method adapts to interfaces utilized in a radio frequency transceiver. The system and method be utilized by an amplifier. The amplifier can include an input stage configurable to one of a plurality of external interfaces. The external interfaces can include a DC feed external interface or a DC decoupling external interface. The amplifier can include an amplification circuit configured to receive a signal at the input stage and amplify the signal. The external interfaces can be associated with a front end module.

20 Claims, 6 Drawing Sheets

AMPLIFIER UTILIZING A CONFIGURABLE INTERFACE TO A FRONT END MODULE

CROSS-REFERENCE TO RELATED APPLICATIONS/INCORPORATION BY REFERENCE

This patent application claims the benefit of and priority to U.S. Provisional Application No. 62/000,935, filed on May 20, 2014, which is hereby incorporated by reference in its entirety.

FIELD OF THE DISCLOSURE

This disclosure generally relates to systems and methods for receiving radio frequency (RF) signals. This disclosure relates to interfaces used in radio frequency systems.

BACKGROUND OF THE DISCLOSURE

Radio frequency receivers are used in a large number of different types of applications, including various communication and sensing applications. Communication and sensing applications can include, but are not limited to, those associated with stationary and mobile stations and equipment, access points (APs), mobile devices, positioning systems (e.g., the Global Positioning System (GPS)), cellular telephones, radars, modems, light sensors, heat sensors, targeting sensors, networks, etc. Such applications can utilize transceivers operating within one or more of a number of different radio frequency bands.

Transceivers can operate within any one or more of the following frequency bands: Global System for Mobile Communications (GSM) bands, 850, 900, 1800, and/or 1900, Wideband Code Division Multiple Access (WCDMA) bands, High Speed Packet Access (HSPA) bands and/or Long Term Evolution (LTE) bands 1, 2, 3, Wireless Local Area Network (WLAN) 802.11 bands, GPS bands, Bluetooth, etc. The frequency bands listed above are exemplary and not listed in a limiting fashion. Transceivers can be employed in any workstation, telephone, desktop computer, laptop, notebook computer, server, handheld computer, mobile telephone, other portable telecommunications device, media playing device, a gaming system, mobile computing device, sensor, radar, or any other type and/or form of sensing, computing, positioning telecommunication or media device.

Radio transceivers often utilize one or more low noise amplifier (LNA) coupled to an antenna via a front end module (FEM) interface. The low noise amplifier is generally input matched to preceding blocks in the transceiver (e.g., components on the front end module) and amplifies the signal received by an antenna coupled to the front end module. The term transceiver as used herein refers to a transmitter, a receiver, or a combination transmitter and receiver.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

DETAILED DESCRIPTION OF EMBODIMENTS

According to one embodiment, the present methods and systems can adaptively support front end module interfaces in a radio transceiver. Transceivers can include a front end module, a power amplifier module (PAM) and a radio frequency integrated circuit (RFIC). A low noise amplifier is provided in the radio frequency integrated circuit and is designed to provide a targeted gain, noise and linearity performance as well as efficient input matching of the termination impedance associated with circuits in the front end module, such as, radio frequency/duplex filters, using a configurable interface in certain embodiments. The low noise amplifier can also be provided as a discrete device between the radio frequency integrated circuit and the front end module or radio frequency filter.

In one embodiment, the low noise amplifier can be part of a set of low noise amplifiers that support a number of bands within a single platform. In one embodiment, the low noise amplifiers are used to fulfill diversity and main receiving operations. In one embodiment, the low noise amplifiers include a configurable interface for front end modules utilizing filter technology that results in a high direct current (DC) impedance (an alternating current (AC) coupled) interface and/or electrostatic discharge (ESD) technology that results in a low impedance DC feed path to ground for electrostatic discharge reasons. The filter technology includes but is not limited to surface acoustic wave (SAW) and/or bulk acoustic wave (BAW) technology. The DC feed path can be embodied as an inductor coupled to ground, a positive power supply, or other low impedance bias node. In one embodiment, the configurable interface does not use AC coupling capacitors placed at the radio frequency integrated circuit, thereby reducing die area and increasing performance. In one embodiment, the low noise amplifier uses passive components associated with the front end module when providing the matched interface.

In one embodiment, a system or method can adaptively support both a current mode (DC-feed to ground) interface and a voltage (AC-coupling) mode interface without additional external matching components. Systems and methods can implement a desired interface with internal matching depending on the front end module architecture. In one embodiment, a front end module includes a number of front end module circuits. In one embodiment, the front end module circuits can include a very high band (VHB) filter with a differential connection including a front end module or external DC-feed path for electrostatic discharge protection, a high band (HB) filter with a single ended connection with or without a front end module or external DC-feed path for electrostatic discharge protection, a low band (LB) filter with a differential connection, and a low band filter with a single ended connection. The low noise amplifier is configurable for each of the front end module circuits listed above in one embodiment. Accordingly, a single topology on the low noise amplifier can be adapted for each type of front end module circuit in one embodiment. The number and types of front end module circuits listed above are exemplary only; different types, numbers and bands of front end module circuits can be utilized without departing from the scope of the invention.

The interface for the low noise amplifier can support both single ended and differential topologies and internal/external matching alternatives according to one embodiment. The radio frequency integrated circuit topology can be adapted to different interfaces simultaneously saving die area, enabling internally matched very high bandwidth operation and improving performance in one embodiment. When DC-feed path is available (at FEM side) a common gate (CG) transistor configuration enables fully internal resistive matching for very high band operation with significant performance in one embodiment.

One embodiment relates an amplifier including an input stage configurable to one of or more external interfaces. The external interfaces include a DC feed external interface or a DC decoupling external interface. The amplifier also includes an amplification circuit can receive a signal at the input stage and amplify the signal.

One embodiment relates a method of processing an RF signal. The method includes receiving a radio frequency signal from a first band circuit of a front end module at a first configurable input stage, and configuring the first configurable input stage for a DC feed external interface or a DC decoupling external interface signal. The method also includes amplifying the radio frequency signal.

One embodiment relates to a system including a front end module and a low noise amplifier. The front end module has a band circuit having a direct current decoupled interface or a direct current feed path interface. The low noise amplifier is adaptable to have a first interface for the direct current decoupled interface or a second interface for the direct current feed path interface.

With reference to FIGS. 1-7, systems for and methods of adapting a low noise amplifier interface can be employed in a transceiver 10. Transceiver 10 can be used in any type of application, including, but not limited to, communication and sensing applications. Transceiver 10 can be part of a communication, computing, sensing, media, entertain or a networking device in certain embodiments.

Transceiver 10 can include a radio frequency integrated circuit 12, a main antenna 28, a front end module 30, a power amplifier module 32, and a transmit/receive switch 34 in one embodiment. Antenna 28 can receive a radio frequency signal which is provided through front end module 30 to radio frequency integrated circuit 12. A radio frequency signal for transmission can be provided from radio frequency integrated circuit 12 through power amplifier module 32 and switch 34 to antenna 28 or through power amplifier module 32, front end module 30, and switch 34 to antenna 28. The hardware content of receiver 10 is exemplary only. The number of antennas, power amplifiers, etc. can vary, and dedicated components like antenna tuning, envelope tracking module, etc. are omitted from FIG. 1 for the sake of clarity. The number of receivers can vary—there can be more receiver chains to support carrier aggregation—i.e. the reception of multiple of component carriers simultaneously. Depending on the receiver architecture, there can be additions/alterations in receiver inputs according to one embodiment.

Figure 1:
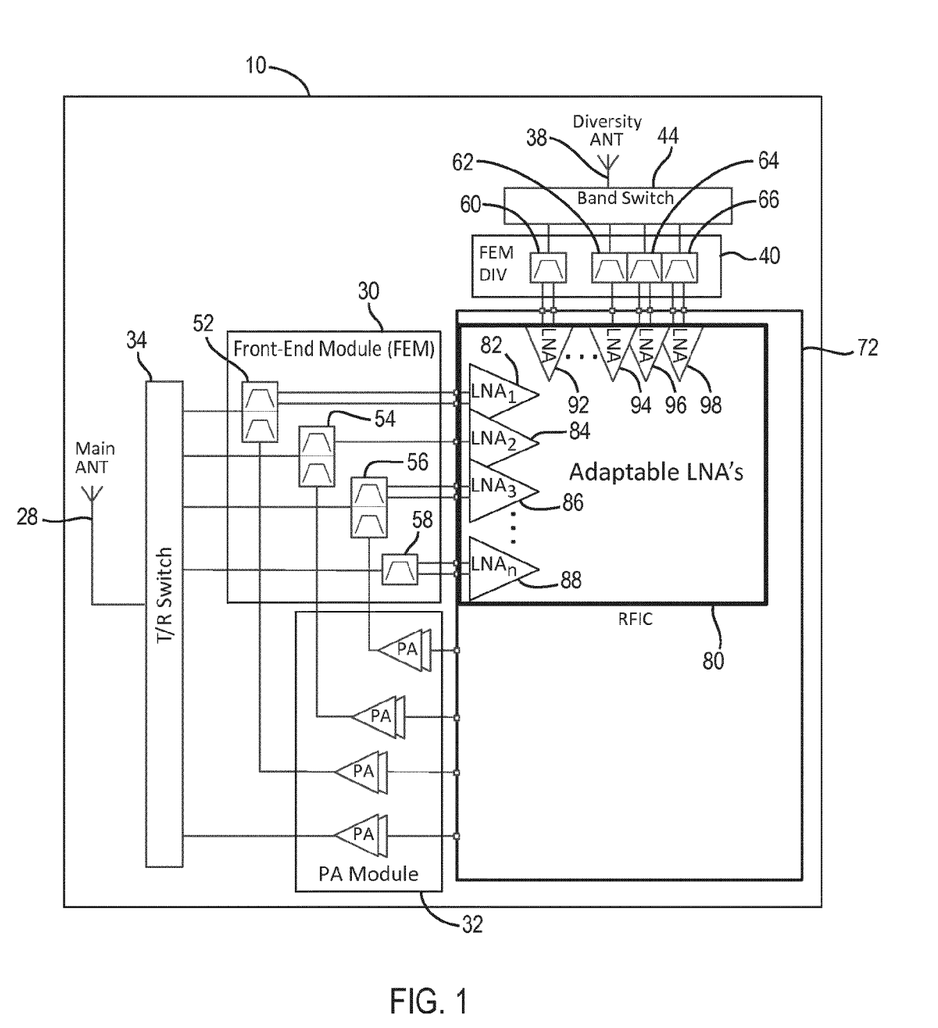
FIG. 1 is a general block diagram of a transceiver including a front end module and a radio frequency integrated circuit according to an embodiment.

In one embodiment, transceiver 10 can include an optional diversity front end module 40, an optional diversity antenna 38, and an optional band switch 44. Diversity front end module 40 is similar to module 30. Switch 44 can be used to select a particular band associated with module 40. Antenna 38 is similar to antenna 28.

Front end module 30 includes a very high band circuit 52, a high band circuit 54, a low band circuit 56, and a low band circuit 58 in one embodiment. Diversity front end module includes a very high band circuit 60, a high band circuit 62, a low band circuit 64 and a low band circuit 66 in one embodiment. Circuits 52, 54, 56, and 58 in module 30 and circuits 60, 62, 64, and 66 can have interfaces such as current (DC—feed to ground) and voltage (DC—decoupling) mode interfaces in one embodiment. In one embodiment, low noise amplifiers 82, 84, 86, 88, 90, 92, 94, and 96 are provided without external matching components.

Radio frequency integrated circuit 12 includes an amplifier circuit 80 comprised of a set of amplifiers 82, 84, 86 and 88 and a set of amplifiers 92, 94, 96 and 98 in one embodiment. Amplifiers 82, 84, 86, 88, 92, 94, 96 and 98 are low noise amplifiers having interfaces adapted for circuits 52, 54, 56, 58, 60, 62, 64, and 66, respectively, in one embodiment. Each of amplifiers 82, 84, 86, 88, 92, 94, 96 and 98 are internally or externally matched to circuits 52, 54, 56, 58, 60, 62, 64, and 66, respectively, by using a configurable interface in one embodiment. In one embodiment, low noise amplifiers 82, 84, 86, 88, 90, 92, 94, and 96 support input matching with or without external components and with differential or single ended input configurations.

Figure 2:
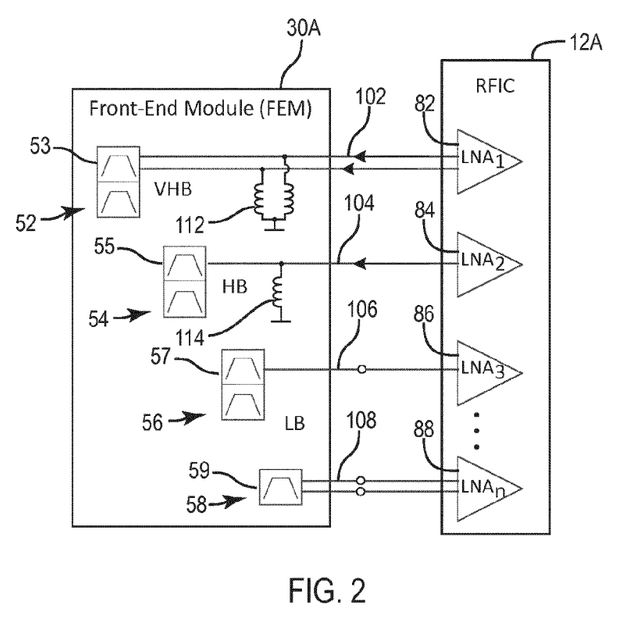
FIG. 2 is a more detailed block diagram of a first type front end module coupled to the radio frequency integrated circuit illustrated in FIG. 1 according to another embodiment.

With reference to FIG. 2, a front end module 30A is coupled to radio frequency integrated circuit 12A. Module 30A is similar to module 30 discussed with reference to FIG. 1, and radio frequency integrated circuit 12A is similar to radio frequency integrated circuit 12 discussed with reference to FIG. 1.

Amplifier 82 of radio frequency integrated circuit 12A is coupled to very high band circuit 52 in module 30A via a differential connection 102. In one embodiment, circuit 52 includes a very high band filter 53. Circuit 52 includes an electrostatic discharge circuit 112 coupled to lines of differential connection 102 in one embodiment. Circuit 112 can include a pair of inductors each respectively coupled between a differential line of connection 102 and ground on front end module 30 in one embodiment. Amplifier 82 can utilize the DC feed path associated with circuit 110 in one embodiment. In one embodiment, amplifier 82 can provide an internally matched current mode interface which corresponds to a DC feed external interface. In one embodiment, a single ended connection can be used instead of differential connection 102.

Amplifier 84 of circuit 12A is coupled to circuit 54 in module 30A which includes a high band filter 55 via a single ended connection 104 in one embodiment. Amplifier 84 can utilize a DC feed path associated with electrostatic discharge circuit 114 in one embodiment. Electrostatic discharge circuit 114 can include an inductor in circuit 114 coupled between signal ended connection 114 on circuit 54 and ground in one embodiment. Circuits 112 and 114 can include external inductive elements in one embodiment. In one embodiment, amplifier 84 is can provide an internally matched current mode interface which corresponds to a DC feed external interface. In one embodiment, a differential connection can be used instead of single ended connection 104.

Amplifier 86 of circuit 12A is coupled to circuit 56 in module 30A which includes a low band filter 57 via a single ended connection 106 in one embodiment. In one embodiment, amplifier 86 can provide an internally matched current mode interface which corresponds to a DC decoupling external interface. In one embodiment, a differential connection can be used instead of single ended connection 106.

Amplifier 88 of circuit 12A is coupled to circuit 58 in module 30A which includes a low band filter 59 via a differential connection 108 in one embodiment. In one embodiment, amplifier 88 can provide an internally matched current mode interface which corresponds to a DC decoupling external interface. In one embodiment, a single ended connection can be used instead of differential connection 108.

Figure 3:
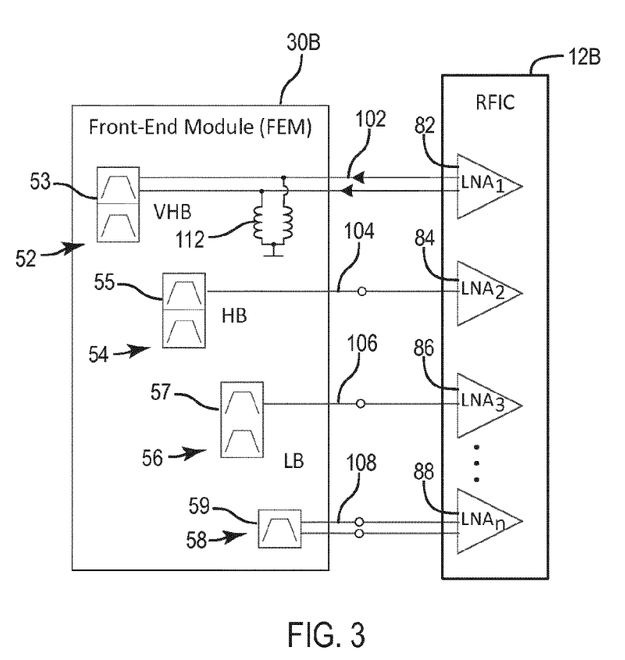
FIG. 3 is a more detailed block diagram of a second type front end module coupled to the radio frequency integrated circuit illustrated in FIG. 1 according to another embodiment.

With reference to FIG. 3, a front end module 30B is similar to front end module 30A discussed with reference to FIG. 2. However, front end module circuit 30B includes a circuit 54 coupled to amplifier 84 of radio frequency integrated circuit 12B via a single end input 104 without an electrostatic discharge circuit 114 (FIG. 2). Circuit 54 includes high band filter 55 in one embodiment. Amplifier 84 of radio frequency amplifier circuit 12B can provide an internally matched current mode interface which corresponds to a DC decoupling external interface in one embodiment.

Figure 4:
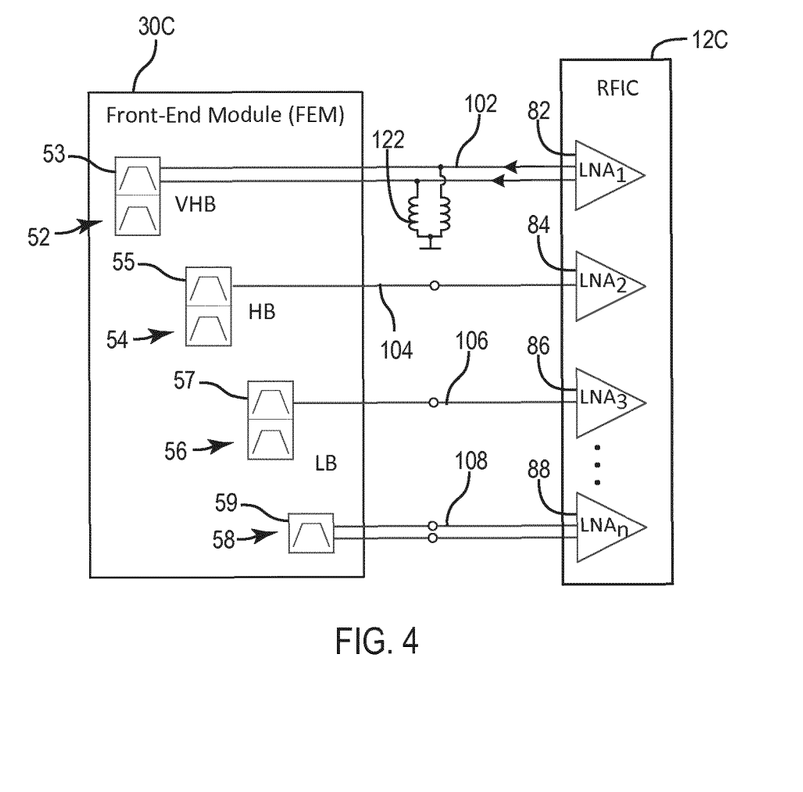
FIG. 4 is a more detailed block diagram of a third type front end module coupled to the radio frequency integrated circuit illustrated in FIG. 1 according to an embodiment.

With reference to FIG. 4, a front end module 30C is similar to front end module 30A discussed with reference to FIG. 2. Amplifier 82 of radio frequency amplifier circuit 12C is coupled to circuit 52 of module 30C by differential connection 102. However, module 30C does not include an electrostatic discharge circuit 112 (FIG. 2). Instead, an electrostatic discharge circuit 122 is provided between amplifier 82 of radio frequency amplifier circuit 12C and circuit 52. Circuit 122 is similar to circuit 112. Circuit 122 can include a pair of inductors coupled between a respective line of connection 102 and ground in one embodiment. Circuit 122 is provided externally to radio frequency integrated circuit 12C and front end module 30C (e.g., on a circuit board). Amplifier 82 of radio frequency amplifier circuit 12C can provide an internally matched current mode interface which corresponds to a DC feed external interface.

Modules 30A-C and radio frequency integrated circuits 12A-C are exemplary only. Various changes can be made to the frequency bands, connections, and interfaces shown in FIGS. 2-4 without departing from the scope of the invention. Although shown with four amplifiers 82, 84, 86, 88, and four circuits 52, 54, 56, 58, other numbers of circuits 52, 54, 56 and 58, amplifiers 82, 84, 86 and 88 and types of circuits 52, 54, 56, and 58 can be utilized without departing from the scope of the invention.

In one embodiment, amplifiers 82, 84, 86, 88, and circuits 52, 54, 56, 58 can be part of a diversity antenna path as opposed to a main antenna path. In one embodiment, amplifiers 82 and 84 are configurable while amplifiers 86 and 88 operate in a single mode (e.g., for a DC decoupled interface). In one embodiment, amplifiers 86 and 88 operate in a single mode and are configurable for differential or single ended operation. In one embodiment, the topology of circuits in amplifiers 82, 84, 86, and 88 are configured via firmware to the appropriate interface. A register, memory, input, etc. can be used to enable/disable certain circuitry in amplifiers 82, 84, 86 and 88 to configure them to one of a voltage mode interface corresponding to a DC decoupling external interface or a current mode interface corresponding to a DC feed external interface. In addition, a register, memory, input, etc. can be used to enable/disable certain circuitry in amplifiers 82, 84, 86 and 88 to configure them to one of a differential or single ended interface.

In one embodiment, the topology of circuits in amplifiers 82, 84, 86, and 88 self-configures to the appropriate one of a single ended voltage mode interface corresponding to a DC decoupling external interface, a differential voltage mode interface corresponding to a DC decoupling external interface, a single ended current mode interface corresponding to a DC feed external interface or a differential current mode interface corresponding to a DC feed external interface when connected to connections 102, 104, 106, and 108, respectively, in response to configuration data, (e.g., in firmware). In one embodiment, the register, memory, or input, etc. also provides the configuration data for each of amplifiers 82, 84, 86, and 88.

In one embodiment, radio frequency integrated circuits 12A-C sense the necessary interface for connections 102, 104, 106 and 108, respectively, and amplifiers 82, 84, 86, and 88 are automatically configured with the appropriate interface. In one embodiment, amplifiers 82, 84, 86, and 88 self-configure to the appropriate one of a voltage mode interface corresponding to a DC decoupling external interface or a current mode interface corresponding to a DC feed external interface when connected to connections 102, 104, 106, and 108, respectively. Sensing circuitry can be utilized to sense connections 102, 104, 106, and 108 and/or a DC external feed for selection of the appropriate interface in one embodiment.

Amplifiers 82, 84, 86, and 88 advantageously utilize features of components in front end modules 30A-C to improve performance. For example at high frequency bands, radio frequency integrated circuits 12A-C can utilize the extra cost associated with circuits 112, 122 to improve performance of amplifiers 82 and 84. By accounting for properties of front end modules 30A-C, additional DC block or DC feed devices (e.g., passive devices that require large die area) inside radio frequency integrated circuits 12A-C are not used by circuits 12A-C, thereby reducing unnecessary use of die area for circuits 12A-C in one embodiment.

Figure 5:
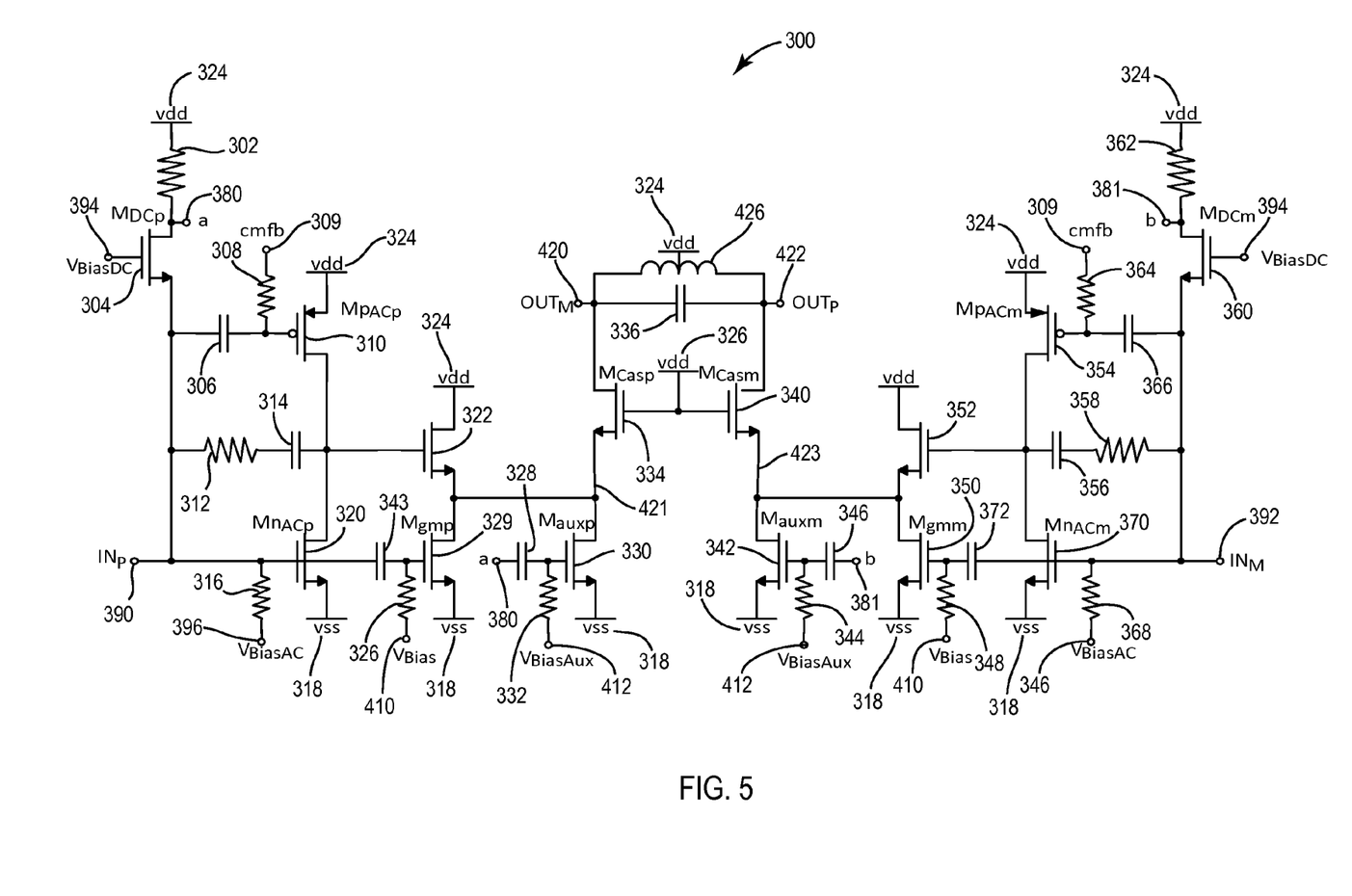
FIG. 5 is an electrical schematic drawing of an amplifier having a configurable interface for the radio frequency integrated circuit illustrated in FIG. 1 according to another embodiment.

With reference to FIG. 5, topology for an amplifier 300 is shown. Amplifier 300 can be utilized as any of amplifiers 82, 84, 86, 88, 90, 92, 94, or 96 in one embodiment. Amplifier 300 is capable of a noise cancellation (NC), common gate amplifier configuration for current mode operation and a noise cancellation, resistive feedback amplifier configuration for voltage mode operation in one embodiment. The noise cancellation (NC), common gate amplifier configuration for current mode operation can be used for a DC feed path interface, and the noise cancellation, resistive feedback (ResFB) amplifier configuration for voltage mode operation can be used for a DC decoupled interface in one embodiment. Amplifier 300 can be adjusted or configured for operation in either configuration by selectively enabling or disabling transistors via firmware in one embodiment.

Amplifier 300 includes a resistor 302, a transistor 304, a capacitor 306, a resistor 308, a transistor 310, a resistor 312, a capacitor 314, a resistor 316, a ground node 318, a transistor 320, a transistor 322, a power node 324 (e.g., Vdd), a resistor 326, a capacitor 328, a transistor 329, a transistor 330, a resistor 332, a transistor 334, a capacitor 336, a transistor 340, a transistor 342, capacitor 343, a resistor 344, a capacitor 346, a resistor 348, a transistor 350, a transistor 352, a transistor 354, a capacitor 356, resistor 358, a transistor 360, a resistor 362, a resistor 364, a capacitor 366, a resistor 368, a transistor 370, a capacitor 372, and an inductor 426. A node 380 is provided between transistor 304 and resistor 302 and at an end of capacitor 328. A node 381 is provided between transistor 360 and resistor 362 and at an end of capacitor 346.

A positive differential input is provided at an input 390 and a negative differential input is provided at an input 392. A VbiasDC node 394 is coupled to a gate of transistor 360 and a gate of transistor 304. A VbiasAC node 396 is provided at resistor 316 and resistor 368. A Vbias signal is provided at a node 410 for resistor 326 and resistor 348. A VbiasAux signal is provided at a node 412 to resistor 332 and resistor 344. A negative differential output terminal 420 is coupled to one end of capacitor 336 and inductor 426, and a positive differential output terminal 422 is coupled to the other end of capacitor 336 and inductor 426. A ground node 318 is coupled to sources of transistor 320, transistor 329, transistor 330, transistor 346, transistor 350, and transistor 370. Inductor 426 can be to an on-chip resonator. The components and interconnections listed above and shown in FIG. 5 are exemplary only. The scope of the invention is not limited to the specific embodiment of amplifier 300 shown in FIG. 5.

Amplifier 300 can operate in a voltage mode for a DC decoupled external interface or a current mode for a DC feed path external interface. In the voltage mode, inductor 426, capacitor 306, resistor 308, transistor 310, resistor 312, capacitor 314, resistor 316, transistor 320, transistor 322, resistor 326, transistor 329, transistor 334, capacitor 336, transistor 340, capacitor 343, resistor 348, transistor 350, transistor 352, transistor 354, capacitor 356, resistor 358, resistor 364, capacitor 366, resistor 368, transistor 370, and capacitor 372 form a noise cancellation, common gate resistive feedback amplifier according to one embodiment. In the current mode, capacitor 306, inductor 426, capacitor 336, resistor 302, transistor 304, capacitor 328, transistor 330, resistor 332, a transistor 334, a capacitor 336, transistor 340, transistor 342, resistor 344, capacitor 346, transistor 360, and resistor 362 form a noise cancellation, resistive feedback common gate amplifier according to one embodiment.

In the voltage mode, transistors 304, 330, 342 and 360 are turned off or disabled by providing a $V_{biasDC}$ signal at node 394 and a $V_{biasAux}$ signal at node 394. In one embodiment, the $V_{biasDC}$ signal at node 394 and a $V_{biasAux}$ signal at node 394 are low (e.g., ground). Transistors 310, 320, 322, 352, 354 and 370 can be biased on or enabled using a common mode feedback (cmfb) signal at node 309 and a $V_{biasAC}$ signal at node 396. The common mode feedback signal can be a low (e.g., ground) and the $V_{biasAC}$ signal can be high to enable operation transistors 310, 320, 322, 352, 354 and 370 in the voltage mode.

Transistors 310 and 320 and resistor 312 and transistors 354 and 370 and resistor 358 form inverters for load matching using capacitors 306, 314, 356, and 366 in one embodiment. In one embodiment, the load matching can be for a 50 ohm matching state. In one embodiment, transistors 322 and 352 perform noise cancellation at respective positive and negative noise cancellation nodes 421 and 423. Nodes 421 and 423 are disposed between transistors 322 and 329 and between transistors 352 and 356, respectively, in the voltage mode in one embodiment.

In the current mode, positive input node 390 and negative input node 392 are DC grounded by a DC impact caused by front end module 30 including circuits 112 or 114. Transistors 310, 320, 322, 352, 354 and 370 are turned off or disabled by providing a high common mode feedback signal (e.g., above ground) at node 309 and providing a low VbiasAC signal at node 396 in one embodiment. Transistors 304, 330, 342 and 394 are turned on or enabled by providing a high $V_{biasDC}$ signal at node 394 and a high $V_{biasAux}$ signal at node 412 in one embodiment. Transistors 330 and 342 provide positive and negative noise canceling at nodes 421 and 423, respectively. Noise is cancelled at drains shared by transistors 330 and 329 and drains shared by transistors 342 and 356 in the current mode in one embodiment.

In the current mode and the voltage mode, transistors 334 and 340 provide cascode stage for amplification. Transistors 334 and 340 are coupled to respective positive and negative noise cancellation node nodes 421 and 423, respectively. $V_{bias}$ signals can be provided at node 410 for appropriately biasing transistor 329 and 350.

Although amplifier 300 is described above with differential input configurations, the topology of amplifier 300 can be configured for a signal ended configuration. In one embodiment, a left side of amplifier 300 can be modified to provide a differential output from a single ended input.

Figure 6:
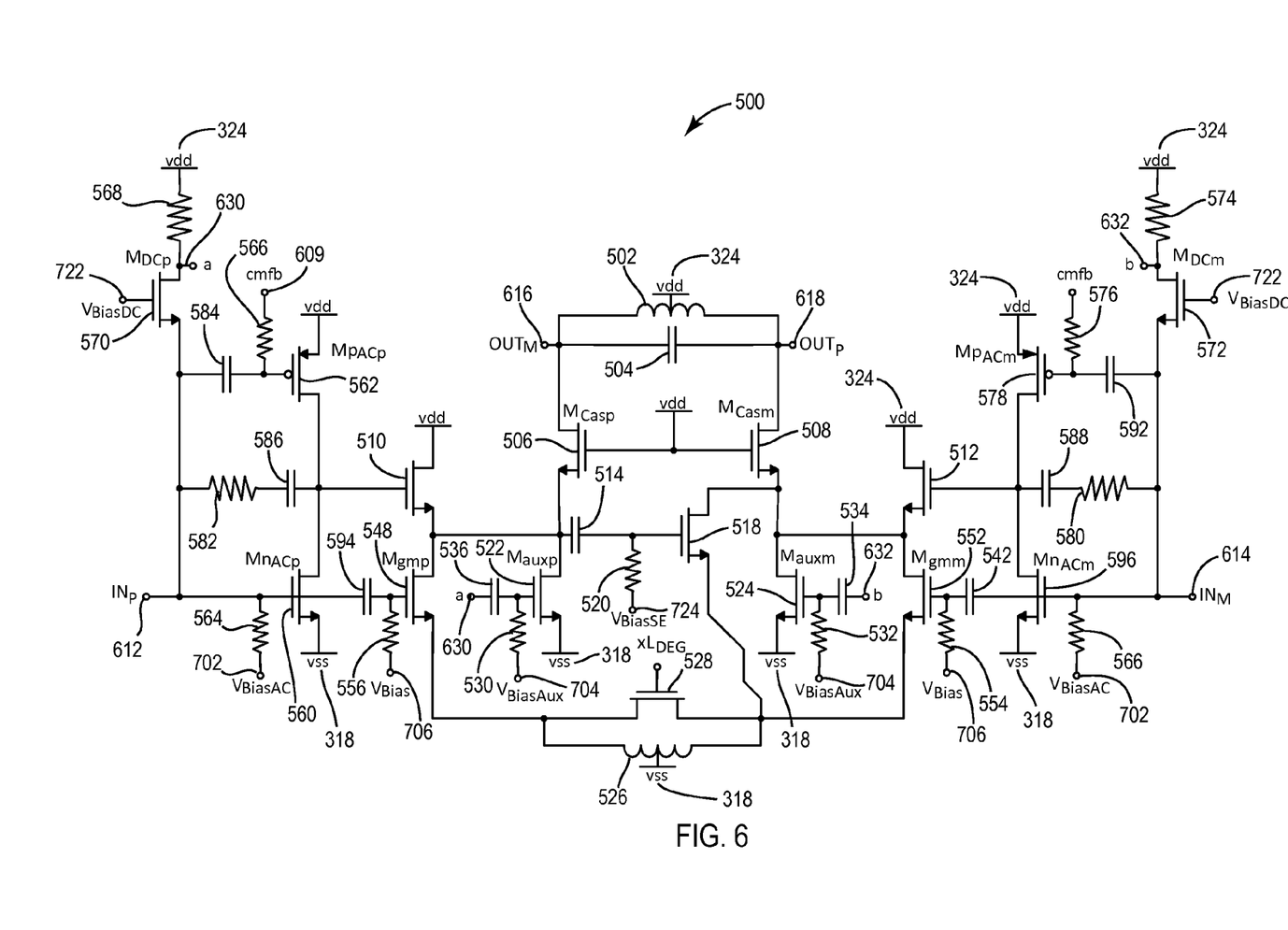
FIG. 6 is an electrical schematic drawing of an amplifier having a configurable interface for the radio frequency integrated circuit illustrated in FIG. 1 according to another embodiment.

With reference to FIG. 6, topology for an amplifier 500 is shown. Amplifier 500 can be utilized as any amplifiers 82, 84, 86, 88, 90, 92, 94, 96, or 98 in one embodiment (FIGS. 1-4) and can be similar to amplifier 300 discussed with reference to FIG. 5. In one embodiment, amplifier 500 can be designed to provide an internally matched voltage mode differential configuration (e.g., for circuit 58 of modules 30A-C in FIGS. 2-4), an internally matched current mode differential configuration (e.g., for circuit 52 of modules 30A and 30B in FIGS. 2-3), an externally matched current mode differential configuration, or an internally matched current mode single ended configuration (e.g., for circuit 54 of modules 30A in FIGS. 2). Amplifier 300 can be adjusted or configured for operation in any of the above listed configurations by selectively enabling or disabling transistors via firmware in one embodiment.

With reference to FIG. 6, amplifier 500 includes an inductor 502, a capacitor 504, a transistor 506, a transistor 508, a transistor 510, a transistor 512, a capacitor 514, a transistor 518, a resistor 520, a transistor 522, a transistor 524, an inductor 526, a transistor 528, a resistor 530, a resistor 532, a capacitor 534, a capacitor 536, a capacitor 542, a transistor 548, a transistor 552, a resistor 554, a resistor 556, a transistor 560, a transistor 562, a resistor 564, a resistor 566, a resistor 568, a transistor 570, a transistor 572, a resistor 574, a resistor 576, a transistor 578, a resistor 580, a resistor 582, a capacitor 584, a capacitor 586, a capacitor 588, a capacitor 592, a capacitor 594, a transistor 596, a power node 324, and a ground node 318. A positive differential input 612 and a negative differential input 614 are coupled to the gates of transistors 560 and 514, respectively.

Inductor 502 embodied as on an on-chip resonator is coupled between a negative differential output terminal 616 and a positive differential output terminal 618. Capacitor 536 is coupled to a node 630, and resistor 568 is coupled to a node 630. Node 632 is coupled to the drain of transistor 572 and to capacitor 534. Transistors 506 and 508 provide a cascode stage. Transistor 528 can be controlled by an $xL_{DEG}$ signal at a gate of transistor 528. In one embodiment transistor 528 acts as an on or off switch responsive to the $xL_{DEG}$ signal at high or low bias voltage.

In an internally matched voltage mode differential configuration, transistors 570, 572, 522, and 524 are turned off or disabled by providing a $V_{biasDC}$ signal at node 722 and a $V_{biasAux}$ signal at node 704 according to one embodiment. In one embodiment, the $V_{biasDC}$ signal at node 722 and a $V_{biasAux}$ signal at node 704 are low (e.g., ground). In addition, a $V_{biasSE}$ signal at a node 724 turns off or disables transistor 518 and associated circuitry (e.g., resistor 520 and capacitor 514) to effect differential operation. Transistors 510, 512, 560, 562, 578, and 596 can be enabled or biased on using a common mode feedback signal at node 609 and a $V_{biasAC}$ signal at node 702. The common mode feedback signal can be low (e.g., ground) and the $V_{biasAC}$ signal can be high (e.g., above ground) to enable transistors 510, 512, 560, 562, 578, and 596.

In an externally matched current mode differential configuration, transistors 570, 572, 522, and 524 are turned off or disabled by providing a $V_{biasDC}$ signal at node 722 and a $V_{biasAux}$ signal at node 704 according to one embodiment. In one embodiment, the $V_{biasDC}$ signal at node 722 and a $V_{biasAux}$ signal at node 704 are low. In addition, a $V_{biasSE}$ signal at a node 724 turns off or disables transistor 518 to effect differential operation. Transistors 510, 512, 560, 562, 578, and 596 are also turned off or disabled in one embodiment. Transistors 510, 512, 560, 562, 578, and 596 can be biased off using a common mode feedback signal at node 609 and a $V_{biasAC}$ signal at node 702. The common mode feedback signal can be low (e.g., ground) and the $V_{biasAC}$ signal can be a low to turn off transistors 510, 512, 560, 562, 578, and 596. Transistor 528 is turned off by the $xL_{deg}$ signal in the externally matched current mode differential configuration. External AC coupling elements components can be used in this mode according to one embodiment. The matching topology can use parallel capacitor circuitry (AC coupling) so no extra AC coupling is needed in one embodiment.

In an internally matched current mode differential configuration, transistors 570, 572, 522, and 552 are turned on or enabled according to one embodiment. Transistors 570, 572, 522, and 552 can be turned on or enabled by providing a high $V_{biasDC}$ signal at node 722 and a high $V_{biasAux}$ signal at node 704 according to one embodiment. In addition, a $V_{biasSE}$ signal at a node 724 turns off or disables transistor 518 to effect differential operation. Transistors 510, 512, 560, 562, 578, and 596 are also turned off in one embodiment. Transistors 510, 512, 560, 562, 578, and 596 can be biased off using a high common mode feedback signal at node 609 and a low $V_{biasAC}$ signal at node 702 in one embodiment.

In an internally matched current mode single ended configuration, transistors 570 and 522 are turned on or enabled according to one embodiment. Transistors 570 and 522 can be turned on by providing a high $V_{biasDC}$ signal at node 722 and a high $V_{biasAux}$ signal at node 704 according to one embodiment. In addition, a $V_{biasSE}$ signal at a node 724 turns on transistor 518 to effect single ended operation. Transistors 572, 578, 596, 552, and 524 and associated resistors 532, 554, 566, 580, 576, and 574 and capacitors 588, 592, 542, and 534 are effectively isolated from the remainder of amplifier 500. Transistors 510, 512, 560, 562, 578, and 596 are also turned off in one embodiment. Transistors 510, 512, 560, 562, 578, and 596 can be biased off using a high common mode feedback signal at node 609 and a low $V_{biasAC}$ signal at node 702 in one embodiment.

Figure 7:
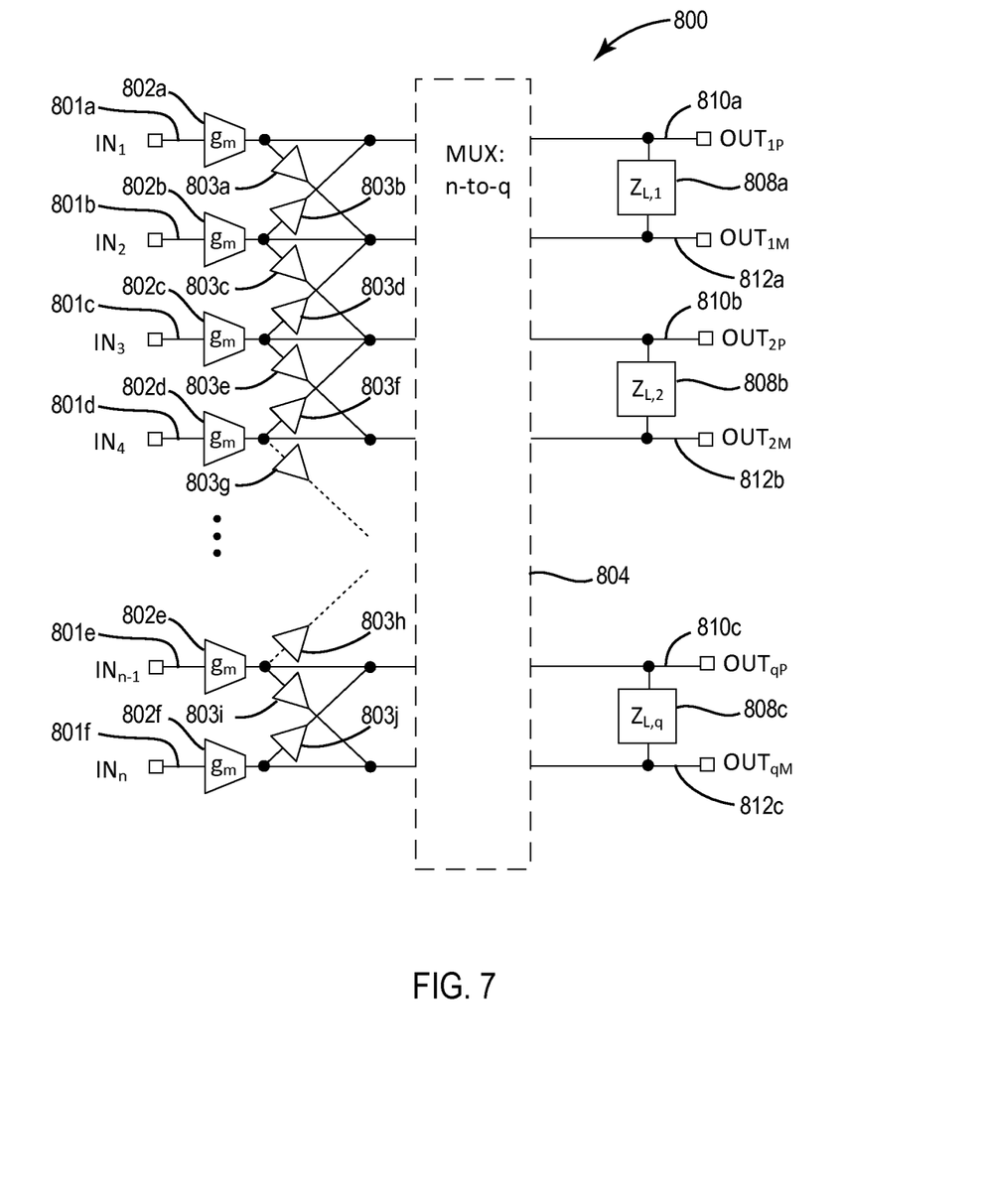
FIG. 7 is a general block diagram of a configurable amplifier according to another embodiment.

With reference to FIG. 7, an amplifier 800 is configured as a highly configurable low noise amplifier. Amplifier 800 includes inputs 801a-f, gain stages 802a-f, buffers 803a-j and a multiplexer 804. Multiplexer 804 provides an output signal across one of loads 808A-C at one pair of positive outputs 810a-c and negative outputs 812a-c. Buffers 803a-j provide cross coupling from one of inputs 801a-f to two other inputs 801a-f, thereby providing better flexibility. In one embodiment, any parallel inputs 801 a-f can form a differential pair for selection by multiplexer 804. Amplifier 800 can advantageously steer current from any of inputs 801a-j to any load 808a-c and accommodate customer needs due to greater access to more inputs 801a-f and buffers 803a-c. Amplifier 800 supports single ended and differential configurations.

While the foregoing written description of the methods and systems enables one of ordinary skill to make and use what is considered presently to be the best mode thereof, those of ordinary skill will understand and appreciate the existence of variations, combinations, and equivalents of the specific embodiment, method, and examples herein. The present methods and systems should therefore not be limited by the above described embodiments, methods, and examples, but by all embodiments and methods within the scope and spirit of the disclosure.

Embodiments may be employed in senders and/or receivers of network elements of a 3GPP network. They may be employed also in senders and/or receivers of other mobile networks such as CDMA, EDGE, UMTS, LTE, LTE-A, GSM, WLAN networks, etc. and also in other senders and/or receivers. In particular, they may be deployed in a terminal (terminal device, user equipment) of the respective technology which may be e.g. a mobile phone, a smart phone, a PDA, a laptop or any other terminal. Also, they may be deployed in base stations of the respective technology such as eNodeB, NodeB, BTS, Access Point, etc.

Names of network elements, protocols, and methods are based on current standards. In other versions or other technologies, the names of these network elements and/or protocols and/or methods may be different, as long as they provide a corresponding functionality.

The figures show logical or functional structures of example embodiments. They are not intended to show an arrangement of the components on a circuit board, substrate, etc. The arrangement of the components may or may not correspond to the logical or functional structure.

If not otherwise stated or otherwise made clear from the context, the statement that two entities are different means that they perform different functions. It does not necessarily mean that they are based on different hardware. That is, each of the entities described in the present description may be based on a different hardware, or some or all of the entities may be based on the same hardware.

Implementation of any of the above described blocks, apparatuses, systems, techniques or methods include, as non-limiting examples, implementations as hardware, software, firmware, special purpose circuits or logic, general purpose hardware or controller or other computing devices, or some combination thereof.

Such hardware may be hardware type independent and may be implemented using any known or future developed hardware technology or any hybrids of these, such as MOS (Metal Oxide Semiconductor), CMOS (Complementary MOS), BiMOS (Bipolar MOS), BiCMOS (Bipolar CMOS), ECL (Emitter Coupled Logic), TTL (Transistor-Transistor Logic), graphene, etc., using for example ASIC (Application Specific) IC (Integrated Circuit) components, FPGA (Field-programmable Gate Arrays) components, CPLD (Complex Programmable Logic Device) components or DSP (Digital Signal Processor) components, MOS components (e.g. transistors) may be implemented in NMOS or PMOS technology. Different MOS components may be based on the same or different of these technologies.

A device/apparatus may be represented by a semiconductor chip, a chipset, or a (hardware) module including such chip or chipset; this, however, does not exclude the possibility that a functionality of a device/apparatus or module, instead of being hardware implemented, be implemented as software in a (software) module such as a computer program or a computer program product including executable software code portions for execution/being run on a processor. A device may be regarded as a device/apparatus or as an assembly of more than one device/apparatus, whether functionality in cooperation with each other or functionality independently of each other. The components of a device may be in a same device housing or in different device housings.

For example, method steps may be implemented in software, firmware, or hardware, in the latter case using any known or future developed hardware technology, or any hybrids of these, as described hereinabove. The method steps may be implemented in a mixture of software, firmware, and hardware.

Various embodiments of user equipment may include, but are not limited to, mobile stations, cellular telephones, personal digital assistants (PDAs) having wireless communication capabilities, portable computers having wireless communication capabilities, image capture devices such as digital cameras having wireless communication capabilities, gaming devices having wireless communication capabilities, music storage and playback appliances having wireless communication capabilities, Internet appliances permitting wireless access and browsing, as well as portable units or terminals that incorporate combinations of such functions.

As used in this application, the term "circuitry" refers at least to all of the following:
 a. to hardware-only circuit implementation (such as implementable in only analog and/or digital circuitry), and
 b. to combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions, and
 c. to circuits, such as a microprocessor(s) or a portion of a microprocessor(s), that require software or firmware for operation, even if the software or firmware is not physically present.

This definition of "circuitry" applies to all uses of this term in this application, including in any claims. As a further example, as used in this application, the term "circuitry" would also cover an implementation of merely a processor (or multiple processors) or portion of a processor and its (or their) accompanying software and/or firmware. The term "circuitry" would also cover, for example and if applicable to the particular claim element, a baseband integrated circuit or applications processor integrated circuit for a mobile phone or a similar integrated circuit in a server, a cellular network device, or other network device.

It is to be understood that what is described above is what is presently considered the preferred embodiments of the present invention. However, it should be noted that the description of the preferred embodiments is given by way of example only and that various modifications may be made without departing from the scope of the invention as defined by the appended claims. That is, the above embodiments are to be understood as illustrative examples of the invention. Further embodiments of the invention are envisaged.

What is claimed is:

1. An apparatus for radio communication, comprising:
 an amplifier input stage selectively configurable to a plurality of external interfaces, the external interfaces comprising a DC feed external interface and a DC decoupling external interface; and
 an amplification circuit configured to receive a signal at the amplifier input stage and amplify the signal.

2. The apparatus of claim 1, wherein said apparatus is one of the following:
 a workstation, telephone, desktop computer, laptop, notebook, computer, server, handheld computer, mobile telephone, other portable telecommunications device, media playing device, a gaming system, mobile computing device, sensor, radar, or any other type and/or form of sensing, computing, positioning, telecommunication or media device.

3. The apparatus of claim 1, wherein the apparatus is a transceiver.

4. The apparatus of claim 1, wherein the apparatus is a radio frequency integrated circuit.

5. The apparatus of claim 1, wherein the external interfaces are single-ended or differential interfaces and the amplifier input stage is configurable to the differential or single-ended interfaces.

6. The apparatus of claim 1, wherein the amplifier input stage comprises a first transistor having a gate coupled to an input, a capacitor coupled between a gate of a second transistor and the input, and a third transistor having a source coupled to the input, the third transistor adapting the amplifier input stage for the DC feed external interface and the third transistor adapting the input stage for the DC decoupling external interface.

7. The apparatus of claim 6, wherein a feedback resistor is coupled between a drain of the first transistor and the input.

8. The apparatus of claim 7, wherein a load element is provided between the drain of the first transistor and a positive supply node.

9. The apparatus of claim 8, wherein the drain of the third transistor is coupled to the positive supply node.

10. The apparatus of claim 6, wherein an output signal at the drain of the first transistor is used to cancel noise for an output signal at a drain of the second transistor in a voltage mode and wherein an output signal at a drain of the third transistor is used to cancel noise for the output signal at the drain of the second transistor in a current mode.

11. The apparatus of claim 1, wherein the amplifier input stage is selectively configured in response to configuration data stored on the apparatus or provided to the apparatus from an external device, wherein the configuration data provides an indication of at least one of a current mode or a voltage mode.

12. The apparatus of claim 11, wherein the configuration data is provided to the apparatus via at least one pin.

13. A method of processing an RF signal, the method comprising:
 receiving a radio frequency signal from a first band of a front end module at a first configurable amplifier input stage, wherein the first configurable amplifier input stage is selectively configurable to a plurality of external interfaces;
 selectively configuring the first configurable amplifier input stage between at least a DC feed external interface and a DC decoupling external interface signal; and
 amplifying the radio frequency signal from the first band.

14. The method of claim 13 further comprising:
 receiving a radio frequency signal from a second band of the front end module at a second configurable amplifier input stage of a second amplifier, wherein the second configurable amplifier input stage is selectively configurable to a plurality of external interfaces;
 selectively configuring the second configurable amplifier input stage between at least a DC feed external interface and a DC decoupling external interface signal; and
 amplifying the radio frequency signal from the second band.

15. The method of claim 14 further comprising:
 receiving a radio frequency signal from a third band of the front end module at a third configurable amplifier input stage of third amplifier, wherein the third configurable amplifier input stage is selectively configurable to a plurality of external interfaces;

selectively configuring the third configurable amplifier input stage between at least a DC feed external interface and a DC decoupling external interface signal; and amplifying the radio frequency signal from the third band.

16. The method of claim 15 further comprising:

receiving a radio frequency signal from a fourth band of the front end module at a fourth amplifier configurable input stage of third amplifier, wherein the fourth configurable amplifier input stage is selectively configurable to a plurality of external interfaces;

selectively configuring the fourth configurable input stage between at least a DC feed external interface and a DC decoupling external interface signal; and amplifying the radio frequency signal from the fourth band.

17. A system, comprising:

a front end module having a filter or duplexer circuit;

a direct current (DC) decoupled interface;

a DC feed path interface; and a low noise amplifier (LNA) comprising an adaptable input stage for selectively receiving from the DC decoupled interface and the DC feed path interface, wherein the DC decoupled interface and the DC feed path interface are external to the LNA.

18. The system of claim 17, wherein the filter or duplexer circuit comprises a very high band circuit including the DC feed path interface, wherein the LNA is adapted to selectively receive from the DC feed path interface.

19. The system of claim 17, wherein the filter or duplexer circuit comprises a high band circuit without a DC feed path interface, wherein the LNA is adapted to selectively receive from the DC decoupled interface.

20. The system of claim 17, further comprising:

a direct feed path between the front end module and an integrated circuit for the LNA, wherein the filter or duplexer circuit comprises a very high band circuit, wherein the LNA is adapted to selectively receive from the DC feed path interface.

* * * * *